US006472270B1

(12) United States Patent
Crawford, Jr. et al.

(10) Patent No.: US 6,472,270 B1
(45) Date of Patent: Oct. 29, 2002

(54) ELIMINATION OF VOIDS AT THE OXIDE/SILICON INTERFACE IN TRENCH-BASED STRUCTURES

(75) Inventors: Franklin D. Crawford, Jr.; Ross Hartshorn; Mohammad M. Farahani, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/800,249

(22) Filed: Mar. 6, 2001

(51) Int. Cl.[7] ............................................. H01L 21/336
(52) U.S. Cl. ........................................ 438/257; 438/424
(58) Field of Search .................................. 438/637, 424, 438/435, 436, 437, 257, 259, 268–270; 257/639

(56) References Cited

U.S. PATENT DOCUMENTS

| 4,943,344 A |   | 7/1990  | Tachi et al. ............... 156/643 |
|-------------|---|---------|--------------------------------------|
| 5,411,913 A |   | 5/1995  | Bashir et al. .............. 437/67   |
| 5,668,403 A | * | 9/1997  | Kunikiyo ................... 257/639 |
| 5,854,137 A |   | 12/1998 | Kuo ........................ 438/714  |
| 5,914,280 A |   | 6/1999  | Gelzinis ................... 438/734  |
| 6,150,234 A | * | 11/2000 | Olsen ....................... 438/424 |
| 6,242,323 B1| * | 6/2001  | Ishisuka et al. ............ 438/435  |
| 6,303,437 B1| * | 10/2001 | Liu .......................... 438/257 |

OTHER PUBLICATIONS

Stanley Wolf and Richard N. Tauber, Silicon Processing for the VLSI Era, Lattice Press, vol. 1, Grown of Thin Oxide, pp. 209–210).*

Christopher P. D'Emic et al., Deep trench plasma etching of single crystal silicon using $SF_6/O_2$ gas mixtures, Journal of Vacuum Science & Technology B, pp. 1105–1111, May/Jun. 1992.

* cited by examiner

Primary Examiner—David Nelms
Assistant Examiner—David Vu
(74) Attorney, Agent, or Firm—Timothy M. Honeycutt

(57) ABSTRACT

Various methods of manufacturing, including oxide film manufacturing, are provided. In one aspect, a method of fabricating an oxide film is provided that includes forming a trench in a semiconductor substrate and exposing the substrate to an oxidizing atmosphere containing oxygen but substantially no chlorine. The substrate is heated to react a surface of the trench with the oxidizing atmosphere to form the oxide film thereon. Chlorine induced oxide-silicon interface voids may be eliminated.

13 Claims, 3 Drawing Sheets

US 6,472,270 B1

ELIMINATION OF VOIDS AT THE OXIDE/ SILICON INTERFACE IN TRENCH-BASED STRUCTURES

BACKGROUND OF THE INVENTION

1. Field of the Invention

This invention relates generally to semiconductor processing, and more particularly to methods of fabricating an isolation structure and an oxide film for use therein.

2. Description of the Related Art

The manufacture of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

Trench isolation is a heavily used isolation technique for both bipolar and metal oxide semiconductor ("MOS") circuits. In many trench-based isolation structures, a damascene process is used to pattern and etch a plurality of trenches in the silicon substrate. The trenches are then refilled with a blanket-deposited CVD silicon dioxide or doped glass layer. To improve topography, the blanket-deposited insulating layer is planarized back to the substrate surface using etchback planarization or chemical mechanical polishing ("CMP").

Most conventional trench isolation structures require an oxide dielectric film to line the walls of the isolation trench. Bulk deposited oxides and doped glasses can exhibit unpredictable adhesion to silicon sidewalls. A high quality thermal oxide film as precursor to bulk insulator deposition is therefore necessary to ensure complete dielectric isolation of the silicon sidewalls of the trench. In conventional processing, the trench is exposed to an oxidizing atmosphere consisting of oxygen and possibly other constituents, such as nitrogen and gaseous hydrogen chloride ("HCl"). Nitrogen serves as a carrier gas. The purpose of the HCl is twofold. First, HCl serves to reduce native oxides present on the walls of the trench. Second, HCl getters contaminant metals present in the silicon, such as sodium and iron. The sources of such contaminant metals are legion and include such things as worker perspiration and out-diffusion from processing chamber parts to name just a few. Metal gettering is also carried out by providing the substrate with interstitial oxygen. Common conventional interstitial oxygen concentrations fall within the 20 to 26 parts per million range.

For high voltage applications, the liner oxide film may be several thousand angstroms thick. Such large thicknesses require relatively high oxidation temperatures and lengthy time periods. A fallout from the high temperature and long duration oxidation processing with HCl is the potential for voids to form within the liner oxide. Void formation is thought to occur as a result of HCl outgassing from the walls of the trench into the liner oxide either during the oxidation process or during later high temperature steps. At the initial stages of the oxidation process, HCl diffuses into and becomes trapped in the sidewalls of the trench. During the later stages of the oxidation process, outgassing occurs. The liberated HCl attacks the liner oxide, producing voids at the silicon-oxide interface. The voids represent sites where electrical shorting across the trench isolation structure can occur, particularly at relatively high operating voltages.

The conventionally used oxidizing atmosphere is the primary source of chlorine. However, there may be other sources that contribute to the problem of oxide void formation. For example, chlorine may be trapped within the internal structures of thermal processing chambers. Chlorine is used to periodically clean out the interiors of semiconductor processing chambers. Quartz structures that are commonly present in these types of chambers can absorb chlorine during these cleaning processes. The trapped chlorine can outgas during later processing of wafers and contribute to void formation along with the deliberately introduced HCl.

The present invention is directed to overcoming or reducing the effects of one or more of the foregoing disadvantages.

SUMMARY OF THE INVENTION

In accordance with one aspect of the present invention, a method of fabricating an oxide film is provided that includes forming a trench in a semiconductor substrate and exposing the substrate to an oxidizing atmosphere containing oxygen but substantially no chlorine. The substrate is heated to react a surface of the trench with the oxidizing atmosphere to form the oxide film thereon.

In accordance with another aspect of the present invention, a method of fabricating an isolation structure is provided that includes forming a trench in a semiconductor substrate and exposing the substrate to an oxidizing atmosphere containing oxygen but substantially no chlorine. The substrate is heated to react a surface of the trench with the oxidizing atmosphere to form an oxide film in the trench. An insulating film is formed on the oxide film that substantially fills the trench.

In accordance with another aspect of the present invention, a method of manufacturing is provided that includes heating a thermal processing chamber having internal structures to a temperature high enough to liberate chlorine trapped in the internal structures. An inert gaseous atmosphere is flowed through a thermal processing chamber to purge chlorine liberated from the internal structures. A first semiconductor workpiece is processed in the thermal processing chamber.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
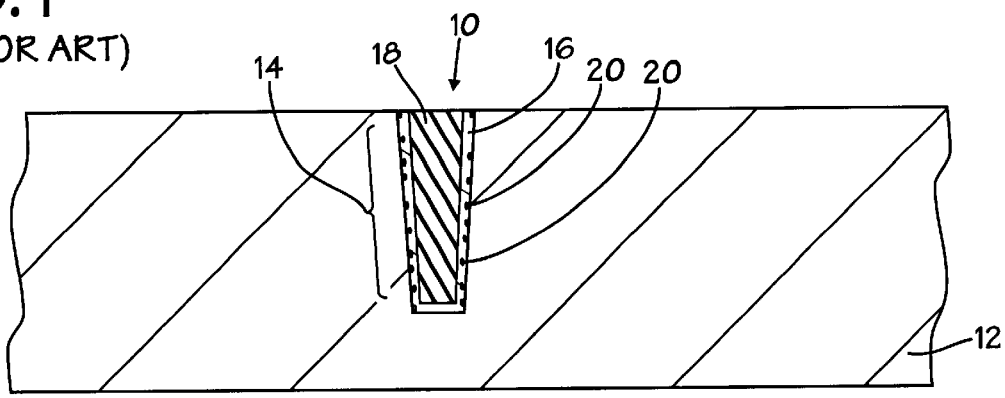
FIG. 1 is a cross-sectional view of an exemplary conventional isolation structure fabricated on a semiconductor substrate.

In the drawings described below, reference numerals are generally repeated where identical elements appear in more than one figure. FIG. 1 depicts a cross-sectional view of an exemplary conventional isolation structure 10 fabricated on a semiconductor substrate 12. The isolation structure 10 is formed in a trench 14 in the substrate 12 and consists of a liner oxide layer 16 that coats the sidewalls of the trench 14 and a bulk insulating fill 18 formed on the liner oxide layer 16. As a consequence of the conventional technique used to fabricate the conventional trench isolation structure 10 shown in FIG. 1, the liner oxide film 16 forms with a plurality of voids 20. The voids 20 generally extend along the interface between the walls of the trench 14 and the liner oxide film 16 and represent potential short-circuiting pathways across the width of the bulk isolation material 18. This may occur when, for example, a bias is applied to areas of the substrate 12 adjacent to the liner oxide 16. If the voltage is high enough, a current may punch through from one void 20 through the isolation material 18 to an adjacent void 20 on the opposite side of the isolation material 18. Obviously, and as noted above, such defects can dramatically affect device performance.

Figure 2:
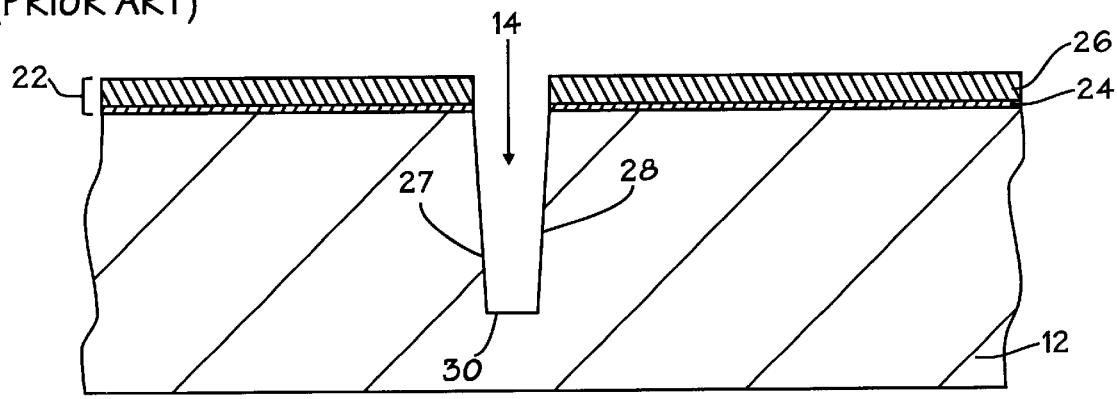
FIG. 2 is a cross-sectional view like FIG. 1 depicting conventional isolation trench formation.
Figure 3:
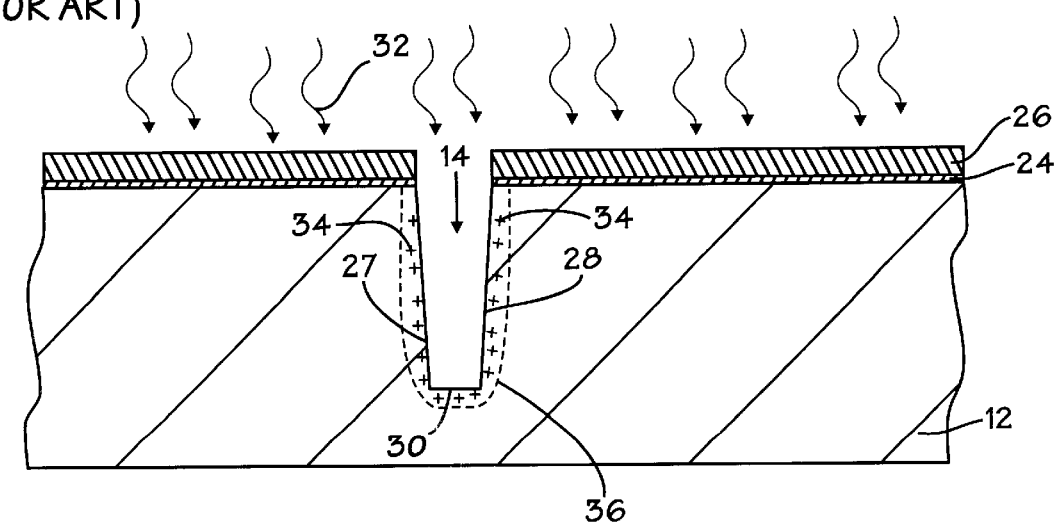
FIGS. 3 and 4 are cross-sectional views like FIG. 2 depicting conventional liner oxide formation.
Figure 4:
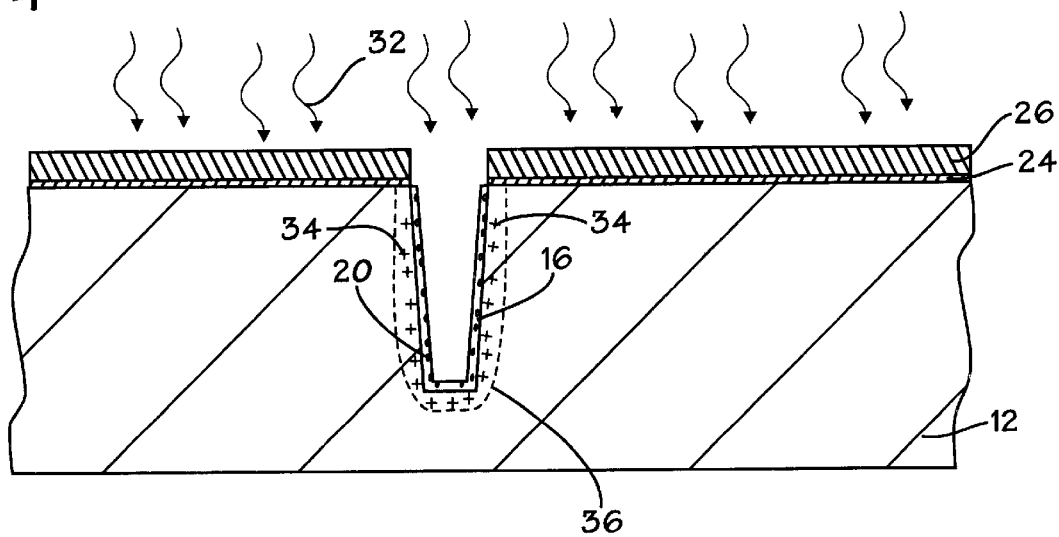

The process steps leading up to the undesirable formation of the voids 20 depicted in FIG. 1 may be understood by referring now to FIGS. 2, 3 and 4. Referring initially to FIG. 2, an oxide/nitride stack 22 consisting of an oxide film 24 and an overlying nitride film 26 is fabricated on the substrate 12. Thereafter, a suitable etch mask (not shown) is applied to the nitride film 26 and an anisotropic etch is performed to cut the trench 14 into the substrate 12. The etch process is set up so that the trench sidewalls 27 and 28 are slightly sloping downward to a trench bottom 30.

Referring now to FIG. 3, the liner oxide film 16 depicted in FIG. 1 is conventionally formed by exposing the substrate 12 to an oxidizing ambient 32. The ambient 32 consists of a mixture of gaseous HCl, oxygen and nitrogen. The HCl constituent is included to clean any native oxide on the sidewalls and bottom 27, 28 and 30 so that a relatively pristine thermal oxide will form thereon. In addition, the HCl is provided as a gettering agent to remove contaminant metals, such as sodium and iron, that may be present in the substrate 12. The HCl is effective at cleansing the exposed surfaces of the trench 14 of native oxide and works well as a gettering agent. However, quantities of HCl, represented by the small crosses 34 are absorbed into the sidewalls 27 and 28 and bottom of the trench 14. This produces a region 36 of the substrate 12 that is engorged with interstitial HCl, either in molecular form or as dissociated hydrogen and chlorine ions. This diffusion of the HCl molecules 34 into the substrate 12 occurs rather early in the oxidation process, before substantial portions of oxide form.

FIG. 4 depicts the substrate 12 later in the liner oxide fabrication process. As the liner oxide film 16 begins to form, the interstitial HCl 34 outgases into the developing oxide film 16. There, the HCl attacks the oxide film 16 and produces the aforementioned voids 20. The formation of the voids 20 may occur even after the liner oxide film 16 is formed. Indeed, various subsequent high temperature steps, such as source/drain and silicide anneals may liberate additional quantities of the trapped HCl 34 and produce additional voids in the liner oxide film 16.

Following the fabrication of the liner oxide film 16, the bulk insulating fill 18 depicted in FIG. 1 is deposited as a blanket film. A subsequent planarization step follows to yield the defined bulk film 18.

Empirical evidence based on manufacturing experience has demonstrated that chlorine is the chief culprit in the formation of the voids 20. Accordingly, a process is provided in accordance with the present invention for fabricating an oxide film for use as a liner oxide, pad oxide or other insulating film in which chlorine is eliminated from the oxidation atmosphere. An exemplary trench isolation structure fabricated in accordance with the present invention may be understood by referring now to FIG. 5. The isolation structure 38 is formed in a trench 40 in a semiconductor substrate 42. The isolation structure 38 consists of a liner oxide layer 44 lining the surfaces of the trench 40 and a bulk insulating fill 46 that is planarized to approximate the topography of the substrate 42. As described more fully below, the liner oxide film 44 is fabricated with an oxidizing atmosphere that is substantially devoid of chlorine. As a result, the void formation problems depicted above are eliminated.

Figure 5:
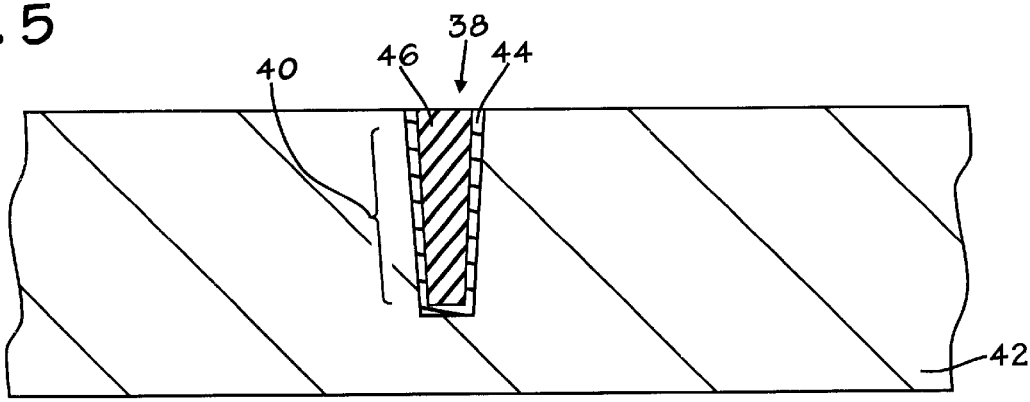
FIG. 5 is a cross-sectional view of an exemplary embodiment of an isolation structure fabricated in accordance with the present invention.
Figure 6:
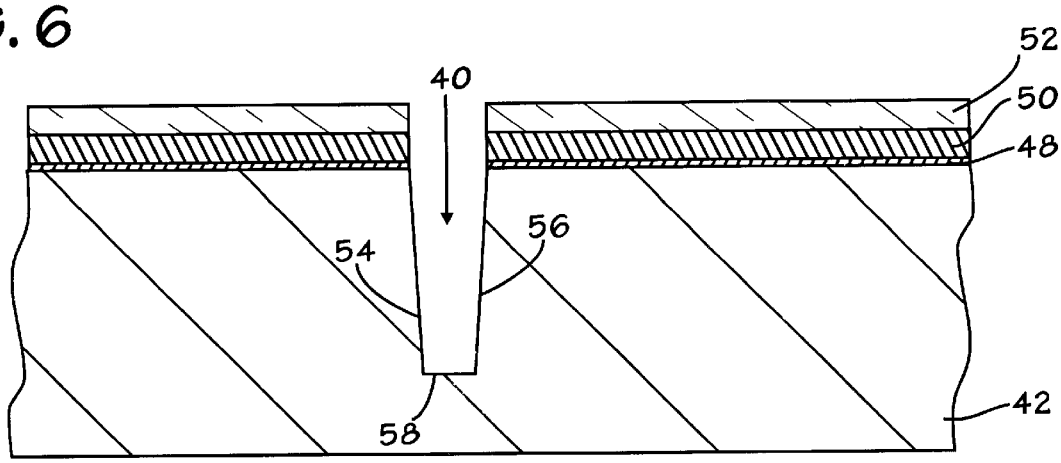
FIGS. 6 and 7 are cross-sectional views like FIG. 5 depicting liner oxide formation in accordance with the present invention.
Figure 7:
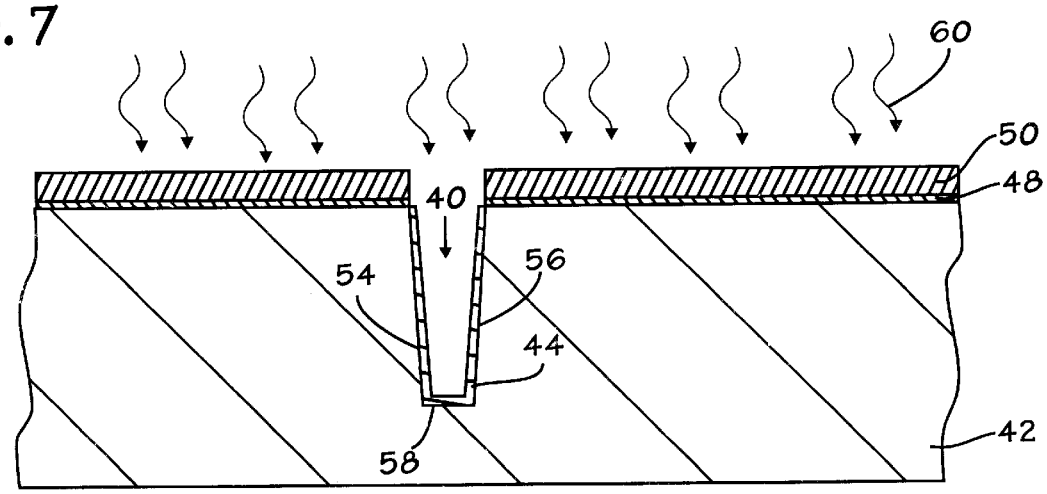

An exemplary process flow in accordance with the present invention for fabricating the isolation structure 38 depicted in FIG. 5 may be understood by referring now to FIGS. 6 and 7. Initially, a pad oxide film 48 is fabricated on the upper surface of the substrate 42, preferably by thermal oxidation. A wet or dry oxidation ambient containing oxygen may be used to establish the film 48 to a thickness of about 25 to 100 Å. Next, an overlying silicon nitride film 50 is formed on the pad oxide film 48 by chemical vapor deposition that may be either low pressure CVD or plasma enhanced CVD. The silicon nitride film may be deposited to a thickness of about 500 to 2000 Å. This oxide/nitride stack serves the same etch protection function as the conventionally used oxide nitride stack 22 depicted in FIGS. 1–4 above. Next, a suitable photomask 52 is patterned on the nitride film 50 with a pattern that corresponds to the desired layout for the isolation trench 40. The isolation trench 40 is next cut into the substrate 42 by directional etching. The directional etch may be by reactive ion etching, chemical plasma etching or like anisotropic etching techniques. Well-known etch chemistries may be used, such as, for example, $CF_4/O_2$ or the like. The etch produces the trench 40 with tapering sidewalls 54 and 56 that terminate at a trench bottom 58. The depth of the trench 40 is largely a matter of design discretion. In an exemplary embodiment, the trench 40 may have a depth of about 3000 to 6000 Å.

Figure 8:
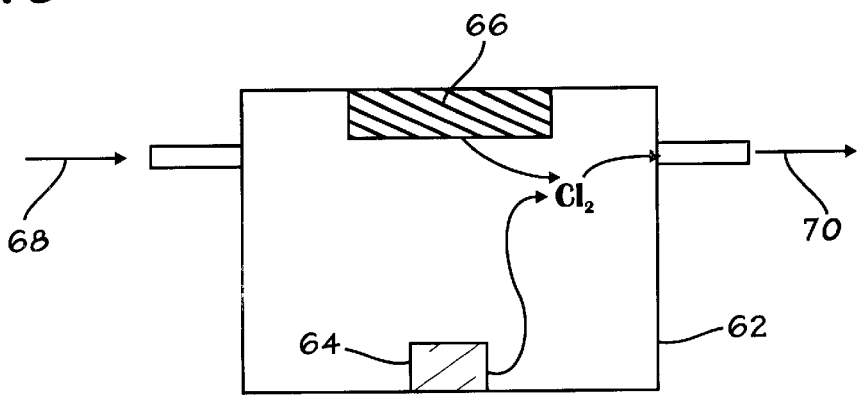
FIG. 8 is a schematic view of a processing chamber undergoing a purge in accordance with the present invention.

Referring now to FIG. 7, the liner oxide film 44 is formed by exposing the substrate 42 to an oxidizing atmosphere 60 that is substantially devoid of chlorine. The oxidation process may be carried out in a thermal processing chamber 62 that is depicted schematically in FIG. 8. The elimination of chlorine from the oxidizing atmosphere 60 is accomplished in two ways. First, HCl or any other chlorine containing compound that would conventionally be used as a reducing agent for oxide is eliminated from the atmosphere 60. Secondly, another potential source of chlorine, namely chlorine trapped within the thermal processing chamber 62, is eliminated through a purging process. As the skilled artisan will appreciate, many types of currently available thermal processing chambers include one or more internal components composed of quartz or other corrosion resistant materials. The thermal processing chamber 62 includes a wafer carrier 64 and a heating element 66 that may consist of a plurality of quartz lamps or other commonly used heating elements. Prior to processing the substrate 42, the thermal processing chamber 62 undergoes a high temperature purging process in which a purge gas mixture 68 is fed into the chamber 62 while the chamber is maintained at a high temperature. The elevated temperature inside the chamber 62 produces an out-diffusion of chlorine that may be trapped in the internal structures 64 and 66. This liberated chlorine is then discharged in an exhaust gas stream 70. In an exemplary embodiment, the purge entails a purge mixture 68 of argon, nitrogen or other like inert gas at about 2000 to 5000 sccm for about 10 to 12 hours with the chamber 62 held at about 900 to 1200° C.

Figure 9:
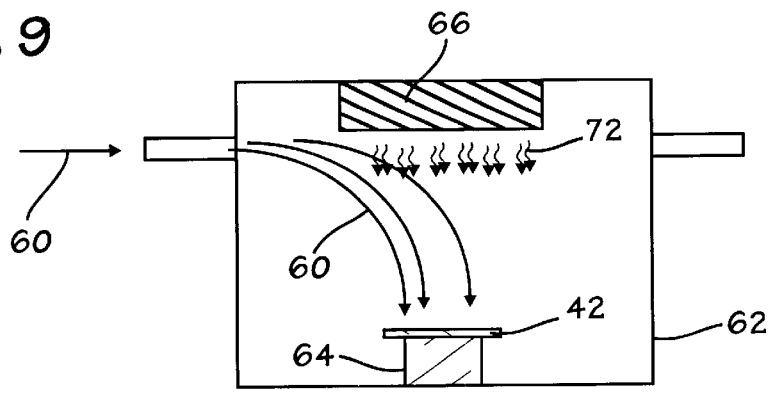
FIG. 9 is a schematic view like FIG. 8 of the processing chamber during processing of a substrate in accordance with the present invention.

Following the purge cycle, the substrate 42 may be inserted into the chamber 62 as shown in FIG. 9 and exposed to the oxidizing ambient 60 with thermal energy 72 supplied by the heating element 66. The liner oxide film 44 may be thus grown to a thickness of about 800 to 2000 Å. The oxidizing ambient may be a dry atmosphere consisting of oxygen, a wet atmosphere consisting of $H_2O$, mixtures of these or the like. The temperature may be about 950 to 1100° C. and the duration may be about 1 to 2 hours.

Eliminating HCl from the oxidation atmosphere does involve removal of a useful source of gettering. However, it is anticipated that increasing the interstitial oxygen concentration of the substrate 42 will make up for the lack of HCl gettering. Conventional wafers are provided with an interstitial oxygen concentration in the range of about 20 to 26 ppm. In contrast, the substrate 42 may by provided with an interstitial oxygen concentration of about 26 to 30 ppm.

Referring again to FIG. 5, the isolation structure 38 is completed by performing a blanket deposition of a bulk insulating material, such as, for example, oxide, tetra-ethyl-ortho-silicate, spin-on-glass or the like followed by a planarization step to yield the bulk fill 46. The planarization may be by etch back planarization, CMP or the like. The oxide nitride stack 48 and 50 may be removed as desired using wet or dry etching techniques well-known in the industry.

The skilled artisan will appreciate that the process in accordance with the present invention may be applied to contexts other than liner oxide for trench isolation. Indeed, the process of the present invention may be applied to reduce the potential for void formation in many stages in semiconductor fabrication wherein a chlorine containing compound is exposed to bare silicon followed by oxide formation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an oxide film, comprising:

forming a trench in a semiconductor substrate;

eliminating substantially all chlorine fiom a processing chamber;

eliminating substantially all chlorine from an oxidizing atmosphere containing oxygen;

exposing the substrate to the oxidizing atmosphere in the processing chamber after the elimination of substantially all chlorine from the processing chamber; and heating the substrate to react a surface of the trench with the oxidizing atmosphere to form the oxide film thereon.

2. The method of claim 1, wherein the semiconductor substrate comprises silicon.

3. The method of claim 2, wherein the semiconductor substrate contains interstitial oxygen to getter metal contaminants.

4. The method of claim 3, wherein the interstitial oxygen is present in a concentration of about 26 to 30 ppm.

5. The method of claim 1, wherein the oxidizing atmosphere comprises oxygen, hydrogen and nitrogen.

6. The method of claim 1, wherein the heating comprises heating to a temperature of about 950 to 1100° C. for about 60 to 120 minutes.

7. A method of fabricating an isolation structure, comprising:

forming a trench in a semiconductor substrate;

eliminating substantially all chlorine from a processing chamber;

eliminating substantially all chlorine from an oxidizing atmosphere containing oxygen;

exposing the substrate to the oxidizing atmosphere in the processing chamber after the elimination of substantially all chlorine from the processing chamber;

heating the substrate to react a surface of the trench with the oxidizing atmosphere to form an oxide film in the trench; and forming an insulating film on the oxide film that substantially fills the trench.

8. The method of claim 7, wherein the semiconductor substrate comprises silicon.

9. The method of claim 8, wherein the semiconductor substrate contains interstitial oxygen to getter metal contaminants.

10. The method of claim 9, wherein the interstitial oxygen is present in a concentration of about 26 to 30 ppm.

11. The method of claim 7, wherein the oxidizing atmosphere comprises oxygen, hydrogen and nitrogen.

12. The method of claim 7, wherein the heating comprises heating to a temperature of about 950 to 1100° C. for about 60 to 120 minutes.

13. The method of claim 7, wherein the forming of the insulating film on the oxide comprises forming oxide on the oxide film.

\* \* \* \* \*